United States Patent [19]
Paschal et al.

[11] Patent Number: 6,091,750
[45] Date of Patent: Jul. 18, 2000

[54] METHOD AND APPARATUS FOR PROVIDING HOT PLUGGING PROTECTION FOR LASER OPTOELECTRONIC DEVICES

[75] Inventors: Matthew James Paschal, Rochester; David Warren Siljenberg, Byron, both of Minn.

[73] Assignee: International Business Machines Corporation, Armonk, N.Y.

[21] Appl. No.: 09/047,829

[22] Filed: Mar. 25, 1998

[51] Int. Cl.[7] .................................................. H01S 3/00
[52] U.S. Cl. ........................................................... 372/38
[58] Field of Search ............................................... 372/38

[56] References Cited

U.S. PATENT DOCUMENTS

| | | | |
|---|---|---|---|
| 4,262,366 | 4/1981 | Eumurian | 455/612 |
| 4,685,097 | 8/1987 | van der Put | 369/54 |
| 4,713,819 | 12/1987 | Yoshikawa | 372/38 |
| 5,296,695 | 3/1994 | Bardos et al. | 372/38 |
| 5,666,045 | 9/1997 | Grodevant | 372/38 |

OTHER PUBLICATIONS

IBM Technical Disclosure Bulletin, vol. 33, No. 3B, Aug. 1990, pp. 90 and 91, and entitled Laser Fault Detection.

*Primary Examiner*—Leon Scott, Jr.
*Attorney, Agent, or Firm*—Joan Pennington

[57] ABSTRACT

A method and apparatus for providing hot plugging protection for a laser optoelectronic device in a laser driver and fault detection circuit are provided. The power supply voltage is compared with a defined threshold potential utilizing a power on reset (POR) circuit. Responsive to detecting a power supply voltage potential below the defined threshold potential, an output control signal is generated. A current interrupt laser driver control signal is generated responsive to the output control signal to interrupt the laser driver current. A clear fault control signal is simultaneously generated responsive to the output control signal.

11 Claims, 3 Drawing Sheets

METHOD AND APPARATUS FOR PROVIDING HOT PLUGGING PROTECTION FOR LASER OPTOELECTRONIC DEVICES

RELATED APPLICATION

The present invention relates to U.S. patent application Ser. No. 09/020,553 filed Feb. 9, 1998, entitled METHOD AND APPARATUS FOR LASER SAFETY (RO997-205) and assigned to the present assignee. The subject matter of the above identified patent application is incorporated herein by reference.

CONTRACTUAL ORIGIN OF THE INVENTION

This invention was made with government support under Cooperative Agreement F33615-94-2-1582 awarded by the United States Department of Air Force. The government has certain rights in the invention.

FIELD OF THE INVENTION

The present invention relates to improvements in laser driver and fault detection arrangements for laser safety, and more particularly to, an improved method and apparatus for providing hot plugging protection for laser optoelectronic devices.

DESCRIPTION OF THE RELATED ART

Often it is desirable to install a circuit card or module, such as a DC laser driver and fault detection circuit during normal power on operation of a data processing system. This operation is typically referred to as hot plugging or a hot plug operation. However, hot plugging of a DC laser driver and fault detection circuit can cause an unsafe high optical power condition. As a result, the laser optoelectronic device could be destroyed.

Many types of laser-based devices and systems, having a wide range of applications, such as in medical technology, in communications and computing technology, are becoming increasingly well known and commercially available. The lasers used in many of these devices and systems are often capable of producing powerful outputs that are potentially harmful to both people and equipment. As a result, many types of safety devices for use in conjunction with laser-based equipment, and standards designed to ensure that laser-based equipment may be safely operated, have been developed and continue to evolve.

A function of a laser's DC current drive feedback loop is to maintain constant optical power. Known fault detection circuits monitor for conditions that indicate an unsafe laser optical power exists. Fault detection schemes exist similar to that reported in the IBM Technical Disclosure Bulletin Vol. 33, No. 3B, August 1990, pages 90 and 91, and entitled LASER FAULT DETECTION.

FIG. 1 illustrates a prior art DC laser driver and laser fault detection circuit. The DC current driver is accomplished by including an operational amplifier (op amp) in a negative feedback loop consisting of op amp B1, transistors Q1 and Q2, resistor R1, the laser diode, the monitor diode, and potentiometer RPOT. The monitor diode current, IM, is fed back through potentiometer RPOT. When the laser diode current increases, the monitor diode current increases. This causes the voltage on the + terminal of op amp B1 to decrease, providing the negative feedback. The regulator monitor detects when the bandgap regulator voltage goes above 3 V, which could cause a laser over power condition. The window detector determines when the + terminal of the DC op amp B1 goes above 1.65 V or below 1.35 V. An open on the monitor diode connection would cause the voltage on the + terminal of the DC op amp B1 to increase above 1.65 V. High laser optical power would cause the + terminal of the DC op amp B1 to decrease below 1.35 V. When a fault is detected, the timing capacitor is charged by the window detector or the regulator monitor. If the fault is still present when the timer expires, the fault detector block causes the PNP control block to shut off the PNP transistor Q2. The fault detector block also forces the + terminal of the DC op amp low and forces the LASER FAULT output high. The power on reset (POR) initialization circuit clears all faults until the laser is powered up. The laser can be turned on by an external control signal LASER ON, and a fault can be cleared by an external control signal LASER RESET.

While the conventional DC laser driver and laser fault detection circuit is generally effective, a need exists for a mechanism that allows for the hot plugging of a DC laser driver and fault detection circuit.

SUMMARY OF THE INVENTION

A principal object of the present invention is to provide an improved method and apparatus for providing hot plugging protection for a laser optoelectronic device in a laser driver and fault detection circuit. Other objects of the invention are to provide such method and apparatus substantially without negative effects, and that overcome disadvantages of prior art arrangements.

In brief, a method and apparatus for providing hot plugging protection for a laser optoelectronic device in a laser driver and fault detection circuit are provided. The power supply voltage is compared with a defined threshold potential utilizing a power on reset (POR) circuit. Responsive to detecting a power supply voltage potential below the defined threshold potential, an output control signal is generated. A current interrupt laser driver control signal is generated responsive to the output control signal to interrupt the laser driver current. A clear fault control signal is simultaneously generated responsive to the output control signal.

BRIEF DESCRIPTION OF THE DRAWING

The present invention together with the above and other objects and advantages may best be understood from the following detailed description of the preferred embodiment of the invention illustrated in the drawings, wherein.

DETAILED DESCRIPTION OF THE PREFERRED EMBODIMENTS

Figure 2:
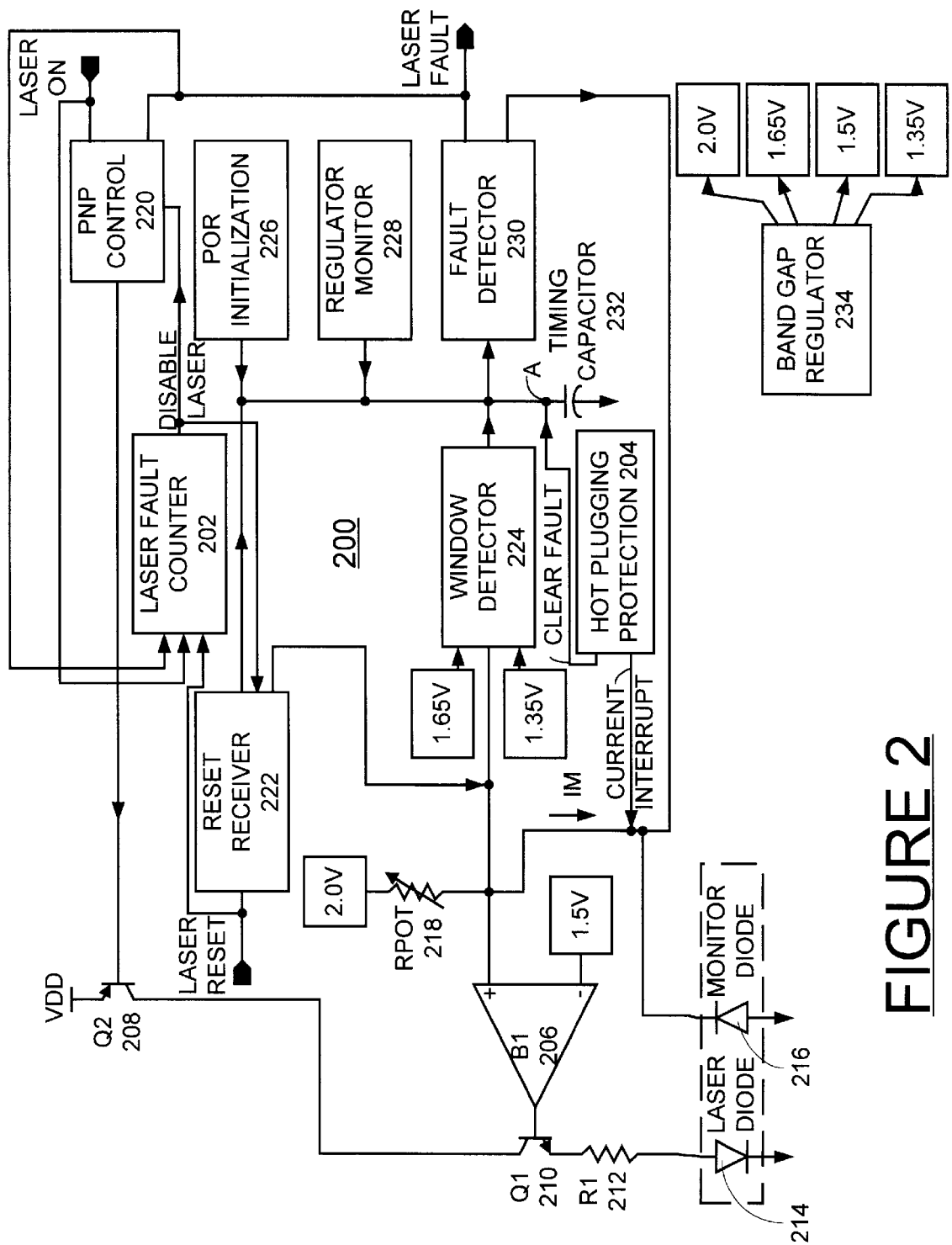
FIG. 2 is a schematic and block diagram representation of a DC laser driver and fault detection circuit of the preferred embodiment.

Having reference now to the drawings, in FIG. 2, there is shown a DC laser driver and fault detection circuit or module generally designated by 200. The DC laser driver and fault detection circuit 200 includes a laser hot plugging protection circuit generally designated by 204 of the preferred embodiment.

The DC laser driver and fault detection circuit 200 includes a laser fault counter 202, an operational amplifier B1 206, a PNP transistor Q2 208, an NPN transistor Q1 210, a resistor R1 212, a laser optoelectronic device or laser diode 214, a monitor diode 216 and a potentiometer RPOT 218 arranged to provide drive current for constant optical power to the laser. An external LASER ON signal is applied to a PNP control block 220 that operatively controls the PNP transistor Q2 208. The DC laser driver and fault detection circuit 200 includes a reset receiver 222, a window detector 224, a power on reset (POR) initialization circuit 226, a regulator monitor 228, a fault detector 230, a timing capacitor 232 and a band gap regulator 234.

The band gap regulator 234 provides multiple voltages, 2.0 V, 1.65 V, 1.5 V and 1.35 V. The monitor diode current, IM, is fed back through potentiometer RPOT 218. When the laser diode current increases, the monitor diode current increases. This causes the voltage on the + terminal of op amp B1 206 to decrease, providing the negative feedback. The POR initialization circuit 226 clears all faults until the laser is powered up.

The window detector 224 detects when the + terminal of the DC op amp B1 goes above 1.65 V or below 1.35 V. An open on the monitor diode connection would cause the voltage on the + terminal of the DC op amp to increase above 1.65 V. High laser optical power would cause the + terminal of the DC op amp B1 to decrease below 1.35 V. The regulator monitor 228 detects when the bandgap regulator voltage goes above 3 V, which could cause a laser over power condition. The fault detector 230 generates a control signal LASER FAULT in response to a detected unsafe laser optical power fault condition.

When a fault is detected, the timing capacitor 232 is charged. If the fault in still present when the timer expires, the output LASER FAULT of the fault detector 230 is forced high, the PNP transistor Q2 208 is shut off by the PNP control 220 responsive to the control signal LASER FAULT, and the + terminal of the DC op amp is forced low. The control signal LASER FAULT is applied to the PNP control 220 and to the laser fault counter 202. The laser can be turned on by an external control signal LASER ON, and a fault can be cleared by an external control signal LASER RESET.

Figure 1:
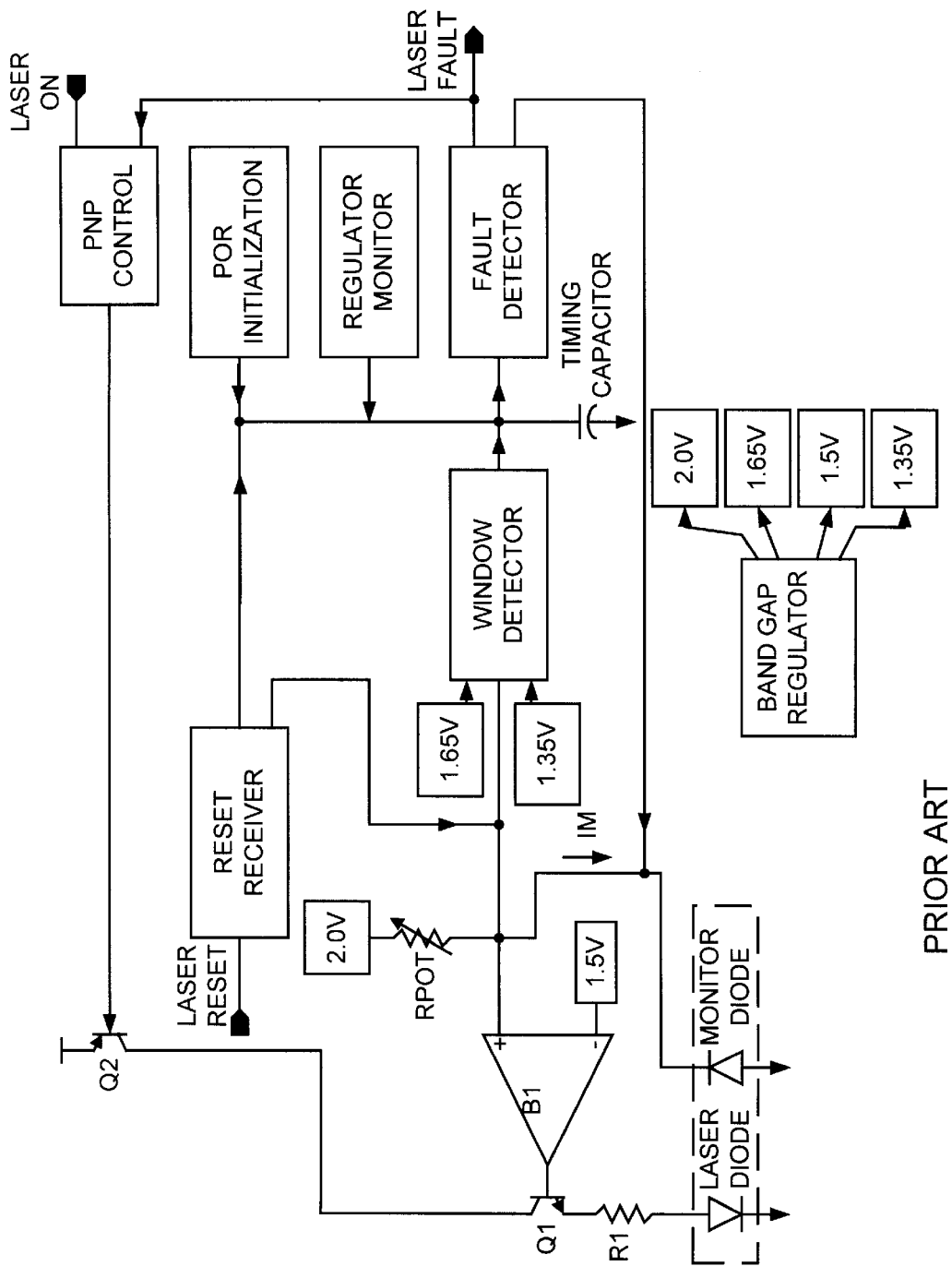
FIG. 1 is a schematic and block diagram representation of a conventional DC laser driver and fault detection circuit.

While hot-plugging, the power supply voltage VDD to the DC current driver can bounce high and low. In the conventional arrangement of FIG. 1, if the power supply voltage VDD droops low enough, the laser 214 could shut down even though the DC current drive op amp B1 is still operational. The feedback loop would then try to supply more current into the laser diode. When the power supply VDD then increases high enough to turn on the laser, the DC current will be high. This will cause a high optical power which could destroy the laser.

In accordance with a feature of the invention, the laser hot plugging protection circuit 204 protects against an unsafe optical power fault condition that otherwise can be caused by hot plugging of the laser drive and fault detection module 200 into a data processing system (not shown). The laser hot plugging protection circuit 204 monitors the power supply voltage VDD. If the laser hot plugging protection circuit 204 detects the power supply voltage VDD below a defined threshold potential, the laser hot plugging protection circuit 204 interrupts drive current to the laser optoelectronic device or laser diode 214 to shut the laser down. Also the laser hot plugging protection circuit 204 simultaneously clears all faults detected by the fault detector 230 in the DC laser driver and fault detection circuit 200. All faults must be cleared to enable the laser 214 to turn on when the power supply VDD rises above the threshold voltage. If the fault was not cleared, the fault detector block 230 would prevent the laser 214 from turning on by maintaining transistor Q2 208 off and op amp B1 206 off. As shown in detail in FIG. 3, a POR circuit 300 is used to detect when the power supply VDD falls below a threshold voltage and then shuts the laser down, both interrupting drive current and clearing all faults detected by the fault detector 230.

Figure 3:
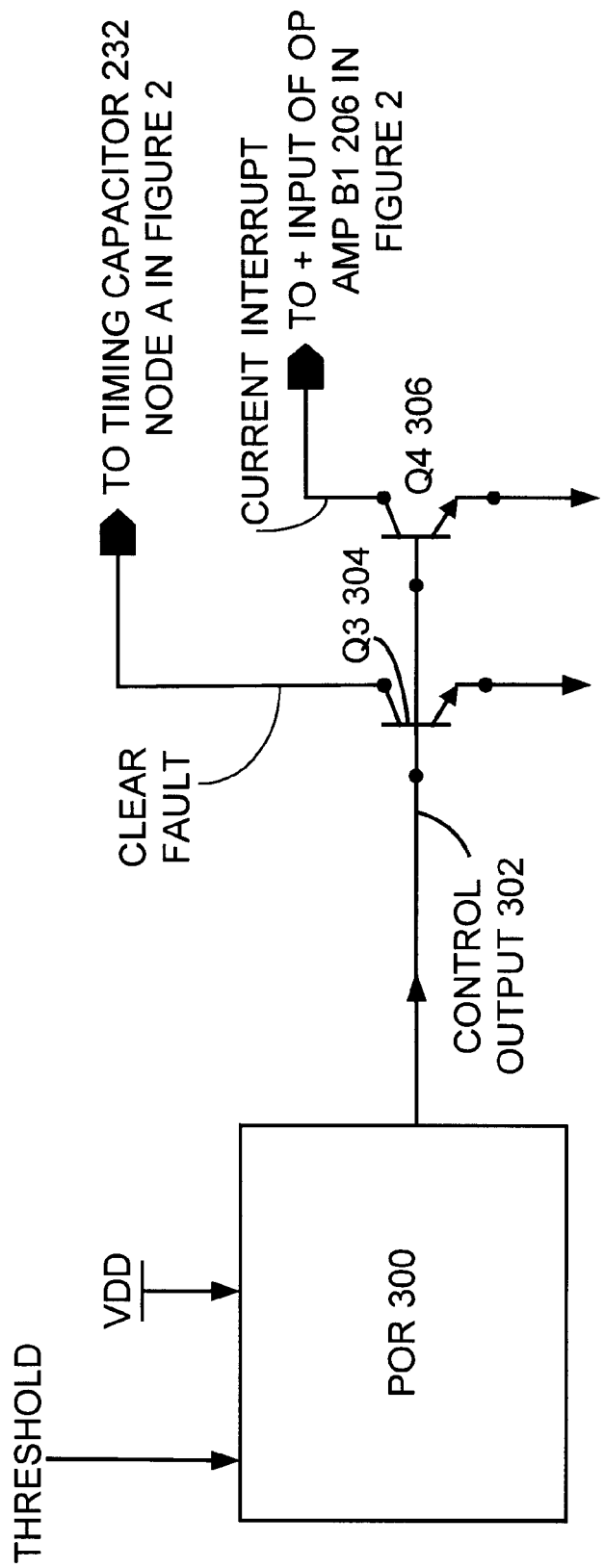
FIG. 3 is a schematic and block diagram representation of a hot plugging protection circuit in accordance with the preferred embodiment.

FIG. 3 shows a schematic diagram of the laser hot plugging protection circuit 204. Laser hot plugging protection circuit 204 is illustrated in simplified and diagrammatic form sufficient for an understanding of the present invention. The utility of the present invention is not restricted to the details of a particular transistor biasing arrangement.

The laser hot plugging protection circuit 204 includes a pair of NPN transistors Q3, 304 and Q4, 306. The laser hot plugging protection circuit 204 includes the power on reset (POR) circuit 300 providing a control output indicated at line 302. This control output signal 302 causes transistors Q3, 304 and Q4, 306 to saturate instantaneously. The positive supply voltage VDD and a defined voltage potential THRESHOLD are received by the POR circuit 300. The POR circuit 300 monitors the supply voltage VDD and compares the detected supply voltage with the defined voltage potential THRESHOLD.

When the POR circuit 300 detects the supply voltage level below the defined voltage potential THRESHOLD, the control output is activated immediately. The control output is applied to the base of the NPN transistors Q3, 304 and Q4, 306 to operatively control the NPN transistors 304 and 206. When NPN transistor Q3, 304 is turned on by the POR control output 302, NPN transistor Q3, 304 forces the timing capacitor node A low in FIG. 2, clearing all faults detected by the fault detector 230. Simultaneously, NPN transistor Q4, 306 forces the + terminal of the DC op amp B1 206 low in FIG. 2. Forcing the + terminal of the op amp B1 206 in FIG. 2 low causes the DC op amp B1 206 to turn off and interrupts current to the laser diode 214.

While the present invention has been described with reference to the details of the embodiments of the invention shown in the drawing, these details are not intended to limit the scope of the invention as claimed in the appended claims.

What is claimed is:

1. An apparatus for providing hot plugging protection for a laser optoelectronic device in a laser driver and fault detection circuit comprising:

detector means for detecting a power supply voltage potential below a defined threshold potential and for generating an output control signal;

means, coupled to said detector means responsive to said output control signal, for generating a current interrupt laser driver control signal, and means, coupled to said detector means responsive to said output control signal, for generating a clear fault control signal.

2. An apparatus for providing hot plugging protection for a laser optoelectronic device in a laser driver and fault detection circuit as recited in claim 1 wherein said detector means comprises a power on reset (POR) circuit for detecting said power supply voltage potential below said defined threshold potential and for generating said output control signal, said output control signal is an instantaneous output control signal.

3. An apparatus for providing hot plugging protection for a laser optoelectronic device in a laser driver and fault detection circuit as recited in claim 1 wherein said means, coupled to said detector means responsive to said output control signal, for generating said current interrupt laser driver control signal comprises a first transistor, said output control signal applied to a base of said first transistor for generating said current interrupt laser driver control signal.

4. An apparatus for providing hot plugging protection for a laser optoelectronic device in a laser driver and fault detection circuit as recited in claim 3 wherein the laser driver includes an operational amplifier and wherein said current interrupt laser driver control signal is applied to a feedback input of said operational amplifier to interrupt drive current to the laser optoelectronic device.

5. An apparatus for providing hot plugging protection for a laser optoelectronic device in a laser driver and fault detection circuit as recited in claim 1 wherein said means, coupled to said detector means responsive to said output control signal, for generating said clear fault control signal comprises a transistor, said output control signal applied to a base of said transistor for generating said clear fault control signal.

6. An apparatus for providing hot plugging protection for a laser optoelectronic device in a laser driver and fault detection circuit as recited in claim 5 wherein the fault detection circuit includes a fault timing capacitor and wherein said clear fault control signal is applied to said fault timing capacitor to clear all faults detected by the fault detection circuit.

7. A method for providing hot plugging protection for a laser optoelectronic device in a laser driver and fault detection circuit, said method comprising the steps of:

detecting a power supply voltage potential below a defined threshold potential and generating an output control signal;

generating a current interrupt laser driver control signal responsive to said output control signal, and simultaneously generating a clear fault control signal responsive to said output control signal.

8. A method for providing hot plugging protection for a laser optoelectronic device in a laser driver and fault detection circuit as recited in claim 7 wherein the step of detecting said power supply voltage potential below said defined threshold potential and generating said output control signal includes the steps of providing a power on reset (POR) circuit for detecting said power supply voltage potential below said defined threshold potential and generating said output control signal, wherein said output control signal is an instantaneous output control signal.

9. A laser driver and fault detection circuit comprising:

a laser optoelectronic device;

a current driver for applying current to said laser optoelectronic device;

a fault detector coupled to said current driver, for detecting a fault condition in said current driver;

detector means for detecting a power supply voltage potential below a defined threshold potential and for generating an output control signal;

means, responsive to said output control signal, for generating a current interrupt laser driver control signal, and means, coupled to said detector means responsive to said output control signal, for generating a clear fault control signal.

10. A laser driver and fault detection circuit as recited in claim 9 wherein said detector means comprises a power on reset (POR) circuit for detecting said power supply voltage potential below said defined threshold potential and for generating said output control signal, said output control signal is an instantaneous output control signal.

11. A laser driver and fault detection circuit as recited in claim 9 wherein said means, responsive to said output control signal, for generating said current interrupt laser driver control signal, and said means, coupled to said detector means responsive to said output control signal, for generating said clear fault control signal comprise a first transistor and a second transistor, said output control signal applied to a base of both said first transistor and said second transistor.

* * * * *